United States Patent [19]
Ly

[11] Patent Number: 5,943,348
[45] Date of Patent: Aug. 24, 1999

[54] METHOD TO CHECK FOR BURST LIMITING IN ERROR CORRECTING SYSTEMS

[75] Inventor: Davis M. Ly, LaJolla, Calif.

[73] Assignee: LSI Logic Corporation, Milpitas, Calif.

[21] Appl. No.: 08/949,737

[22] Filed: Oct. 14, 1997

[51] Int. Cl.[6] .................................................. H03M 13/00
[52] U.S. Cl. ........................ 371/38.1; 371/41; 371/37.01
[58] Field of Search .......................... 371/38.1, 41, 37.01

[56] References Cited

U.S. PATENT DOCUMENTS

| | | | |
|---|---|---|---|
| 3,958,220 | 5/1976 | Marshall | 340/40.3 |
| 4,455,655 | 6/1984 | Galen et al. | 371/37.7 |
| 4,597,083 | 6/1986 | Stenerson | 371/37.2 |
| 4,667,327 | 5/1987 | Bright et al. | 371/47.1 |
| 5,241,546 | 8/1993 | Peterson et al. | 371/38.1 |
| 5,255,136 | 10/1993 | Machado et al. | 360/77.02 |
| 5,280,488 | 1/1994 | Glover et al. | 371/37.11 |
| 5,323,402 | 6/1994 | Vaccaro et al. | 371/37.08 |
| 5,365,529 | 11/1994 | Mester | 371/37.11 |
| 5,384,786 | 1/1995 | Dudley et al. | 371/37.11 |
| 5,440,570 | 8/1995 | Wei et al. | 371/37.08 |
| 5,517,509 | 5/1996 | Yoneda | 371/37.12 |
| 5,699,369 | 12/1997 | Guha | 371/41 |
| 5,754,563 | 5/1998 | White | 371/37.6 |

*Primary Examiner*—William Grant
*Assistant Examiner*—McDieunel Marc
*Attorney, Agent, or Firm*—David K. Lucente; Richard J. Holzer, Jr.

[57] ABSTRACT

Generally, a method checks the error signals of the interleaves to determine if the number of error bursts, burst error lengths or burst size is exceeded. These values are predetermined limits. To this end, the present invention tracks the number of errors and attempts to "fit" the errors in the programmed parameters of the burst size and burst limit values, such as illustrated above. If there is no fit, then an error signal is provided by burst limit checker.

20 Claims, 6 Drawing Sheets

|  | j = | 0 | 1 | 2 | 3 | 4 | 5 | | n/3 |
|---|---|---|---|---|---|---|---|---|---|
| interleave 0 | | 0 | 1 | 1 | 0 | 1 | 0 | ... | 0 |
| interleave 1 | | 0 | 1 | 1 | 0 | 0 | 0 | ... | 0 |
| interleave 2 | | 0 | 1 | 0 | 0 | 1 | 0 | ... | 0 |

|  | j = | 0 | 1 | 2 | 3 | 4 | 5 | | n/3 |
|---|---|---|---|---|---|---|---|---|---|
| interleave 0 | | 0 | 1 | 1 | 0 | 1 | 1 | ... | 0 |
| interleave 1 | | 0 | 1 | 1 | 0 | 0 | 0 | ... | 0 |
| interleave 2 | | 0 | 1 | 0 | 0 | 1 | 0 | ... | 0 |

METHOD TO CHECK FOR BURST LIMITING IN ERROR CORRECTING SYSTEMS

FIELD OF THE INVENTION

The present invention relates to data transmission and more particularly to error detection and correction.

BACKGROUND OF THE INVENTION

The integrity of data stored in storage systems is typically protected by error detection or correction code methods. Shown in FIG. 1 is a block diagram of a small computer system interface (SCSI) controller 100. Data is received from a SCSI bus 105 and provided through the blocks shown to a buffer manager 110. Data flow is controlled by buffer manager 110, and data is provided to a disk FIFO 120 and an Error Correction Coding (ECC) engine 130. ECC engine 130 encodes the received data with a generator polynomial $g(x)$. In this manner ECC bytes are created and are transmitted to a disk formatter 140 concurrently with the data from disk FIFO 120. The ECC bytes are appended to the data by disk formatter 140 and then provided to a storage device, such as a hard drive (not shown), which is coupled to lead 145. The hard drive typically stores the data in 512 byte sectors with the multiple ECC bytes appended at the end.

The data sector is read from the drive and interleaved, usually a 3-way interleave. 3-way interleave is typical due to constraints on how many bytes the ECC logic can decode, i.e., the ECC logic cannot decode the entire sector. To this end, the ECC bytes usually contain an ECC byte for each interleave. For example, the following data sector

| 0 | 1 | 2 | 3 | ... | N-2 | N-1 | is 3-way interleaved as

| 0 | 3 | 6 | ... | N-3 |
| 1 | 4 | 7 | ... | N-2 |
| 2 | 5 | 8 | ... | N-1 |

, where each row represents an interleave and the number of columns equals n/3.

For a read operation, disk formatter 140 receives the interleaved sector as a plurality of code words. Each code word can be represented as a polynomial $c(x)$. Thus, the data bytes that form the code words of each interleave can be represented as a polynomial defined as $v(x)=c(x)+e(x)$, where $e(x)$ is an error polynomial that represents at most t errors in the stored data. From the received polynomial $v(x)$, partial syndromes can be defined. The partial syndromes, in turn, are used to compute the coefficients of an error-locator polynomial $\Lambda(x)$. The partial syndromes and the coefficients of the error-locator polynomial determine the error-locator polynomial. Next, the error value or magnitude is determined for each error location. Finally, the error is corrected. A more detailed discussion of the above can be obtained from Weldon, E. J., "Error Correcting Codes with Application to Digital Storage Systems," Seminar Notes, University Consortium for Continuing Education (May 1993), which is incorporated herein by reference.

To illustrate, an interleaved 3-burst Reed Solomon code has an error-locator polynomial defined to be:

$$\Lambda(x)=\Lambda_3 x^3+\Lambda_2 x^2+\Lambda_1 x+1 \qquad (1).$$

$\Lambda_3$, $\Lambda_2$ and $\Lambda_1$, are 8-bit symbols or field elements in Galois Field $GF(2^8)$. A Galois Field $GF(2^m)$ is a distinct set of $2^m-1$ m-bit symbols of $\alpha^i$ where i is an integer ranging from 0 to $2^m-2$, and can be used to index or locate the ith m-bit symbol within an encoded interleaved message or sector. The logarithms of the implicative inverse of the roots $(\log_2(\alpha^{-i}))$ of this error-locator polynomial are the error offsets or locations of the interleaved sector with 0 being the farthest encoded ECC byte. Since for an 8-bit $GF(2^8)$ there are only 255 field elements to check, the simplest way to find the zeros or roots of the error-locator polynomial $\Lambda(x)$ is by trial and error, a process known as a Chien search. $\Lambda(\alpha^{-i})$ is computed for each i and checked for zero. In other words, $$\Lambda(\alpha^{31-i})=\Lambda_3 x^3+\Lambda_2 x^2+\Lambda_1 x+1|_{x=\alpha^{-i}}=0 \qquad (2).$$

Executing Equation 2 for each i requires four multipliers (about 300 gates each), two squaring circuits (about 50 gates each), on 4-input adder (8-bitwise 4-input exclusive-OR) and a logarithm circuit of the inverse of i to produce $\alpha^{-i}$ in $GF(2^8)$. For a n-way interleaved Chien search in parallel, the gate count could run up to 4n multipliers, 2n squaring circuits and a logarithm circuit. Besides, the critical path for this type of execution which goes through a squaring circuit (about 2 ns), two multipliers (about 12 ns) and an adder (about 2 ns) requires roughly 30 ns. Consequently, this logic is restricted to around a 33 MHz 8-bit NRZ clock speed.

In addition to data errors occurring randomly in digit positions of $v(x)$, some disturbances in the data path may corrupt an entire block of digits. For example, platter defects of hard disk drives usually affect more than one digit. A burst error is an error that occurs over a sequence of b digits of a data block. For a burst error sequence, the first and bth digits are in error, while the intermediate digits may or may not be in error. A burst error can extend over the interleaves. An error correction code implemented as an L-way interleave with a burst-correcting capability of M provides a code that has a burst-correcting capability of LM.

A burst-correction capability of an ECC can be limited to improve (decrease) the probability of miscorrection. Some hard disk controller ECCs have burst limiting logic that operates after all the error patterns are identified. Such configuration involves sorting all error locations numerically to determine subsequent burst spans. As a result, additional hardware overhead is imposed and on-the-fly performance will degrade.

A need exists for an ECC device that includes a high-speed Chien Search circuit that requires less logic, thereby reducing design cost, complexity and physical area requirements. A further need exists for an ECC device that has burst-limiting capability which minimizes on-the-fly performance degradation, hardware overhead and associated costs. The present invention meets these needs.

SUMMARY OF THE INVENTION

The present invention includes a method for check for burst errors that exceed predetermined values. The method includes receiving error location signals and checking the error location signals to determine if predetermined limits are exceeded. When at least one of the predetermined limits is exceeded, an error signal is provided. To aid on-the-fly error correction, the step of checking is done concurrently with the generation of the error location signals. Thus, an error signal is generated immediately after one of the predetermined limits is exceeded. The predetermined limits include a burst size value, a burst error length value and a number of bursts value.

Numerous other advantages and features of the present invention will become readily apparent from the following detailed description of the invention and the embodiments thereof, from the claims and from the accompanying drawings in which details of the invention are fully and completely disclosed as a part of this specification.

DETAILED DESCRIPTION OF THE PREFERRED EMBODIMENT

Figure 1:
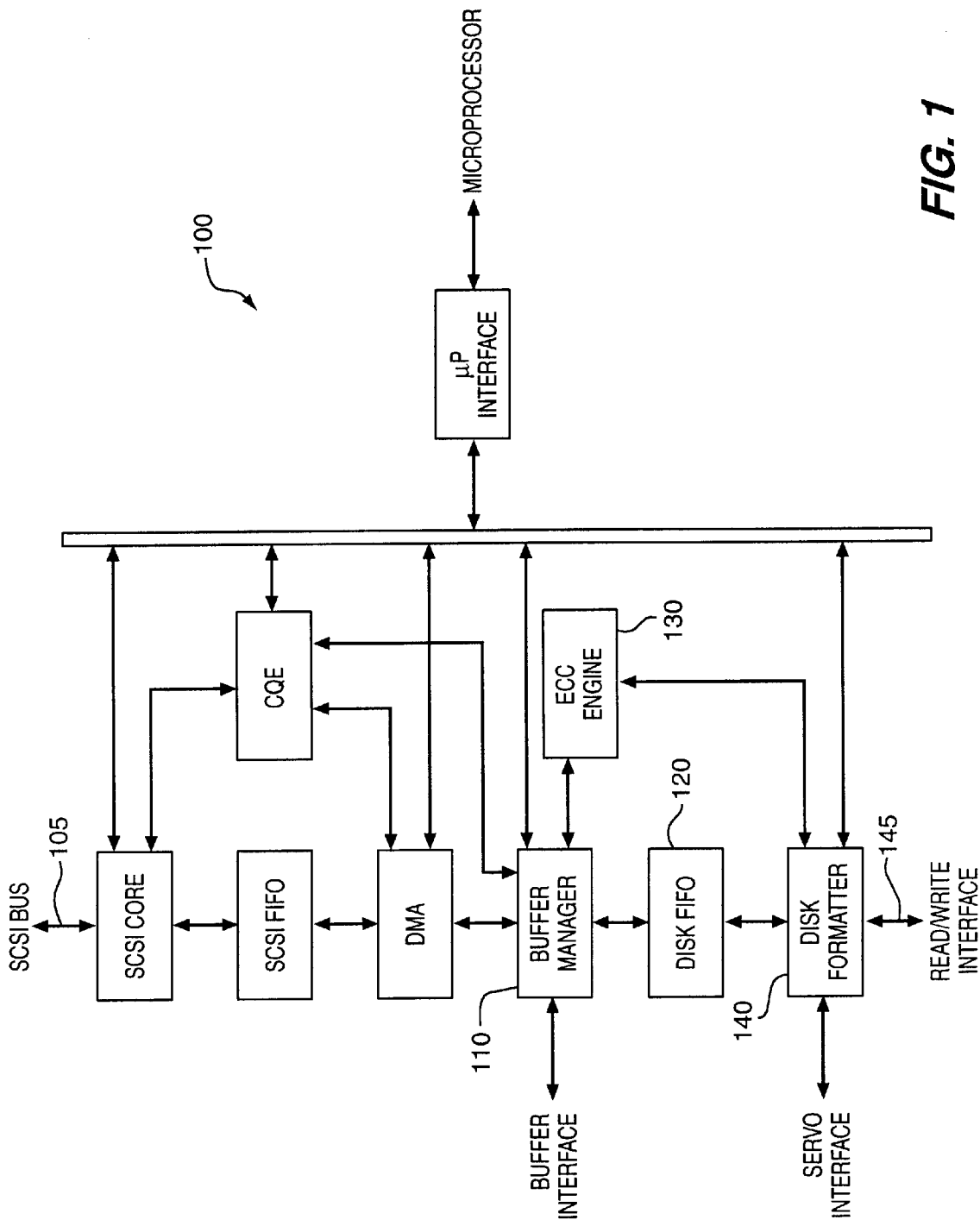
FIG. 1 is a block diagram of a SCSI device controller.

While this invention is susceptible of embodiment in many different forms, there is shown in the drawings and will be described herein in detail a specific embodiment thereof with the understanding that the present disclosure is to be considered as an exemplification of the principles of the invention and is not to be limited to the specific embodiment described.

The present invention divides Equation 2 by a factor of x to obtain:

$$\Lambda(\alpha^{-i})/x = \Lambda_3 x^2 + \Lambda_2 x + \Lambda_1 + x^{-1}|_{x=\alpha^{-i}} = 0 \quad (3).$$

Now, solving for Equation 3 involves only 2n multipliers, n squarers and a logarithm operator for all n interleaves. The multiplicative inverse function introduced by Equation 3 is performed by using a preferred 8-bit linear-feedback shift register (LFSR) described below. The LFSR uses approximately fifty gates and has the approximate setup time of a D-type flip-flop to produce the inverse output. Consequently, the critical path is reduced to about 16 ns (through a squarer, a multiplier and an 4-input adder). This allows the device of the present invention to operate at data rates exceeding 400 Mbit/sec.

Figure 2:
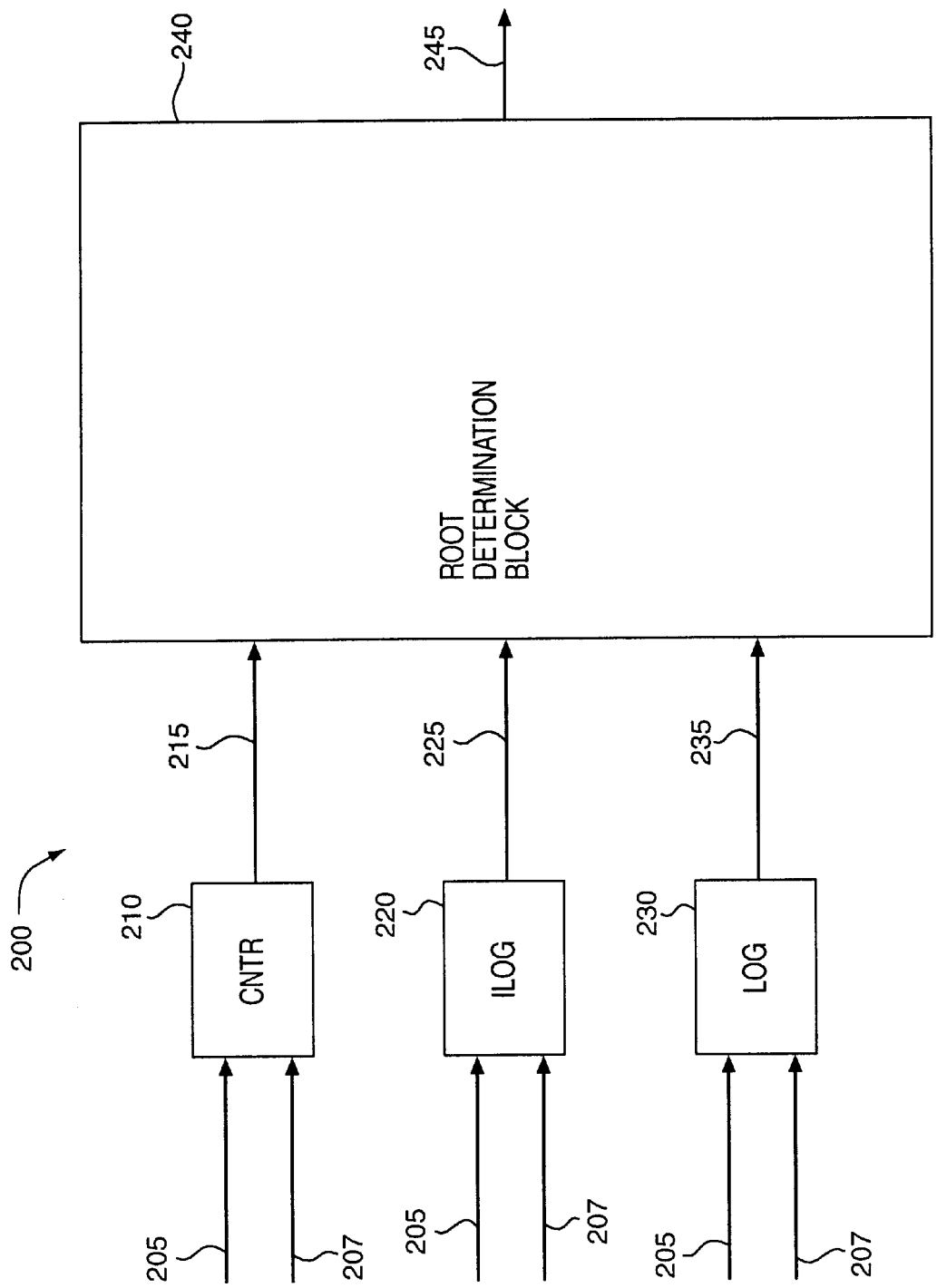
FIG. 2 is a block diagram of a Chien Search device according to the present invention.

FIG. 2 illustrates a block diagram of a Chien search device 200 according to the present invention. Chien search device 200 preferably includes an 8-bit counter 210 that is used to generate consecutive values of i from 0 up to 254 (or less depending on a sector size). The output of counter 210 is provided via a lead 215 to root determination block 240.

A LFSR 220 generates $\alpha^{-i}$ and a LFSR 230 generates $\alpha^i$. The outputs of LFSRs 220 and 230 are provided on respective leads 225 and 235 to root determination block 240. Counter 210 and LFSRs 220, 230 receive an enable signal on leads 205 and a clock signal on leads 207. Root determination block 240 provides an output on lead 245.

Figure 3:
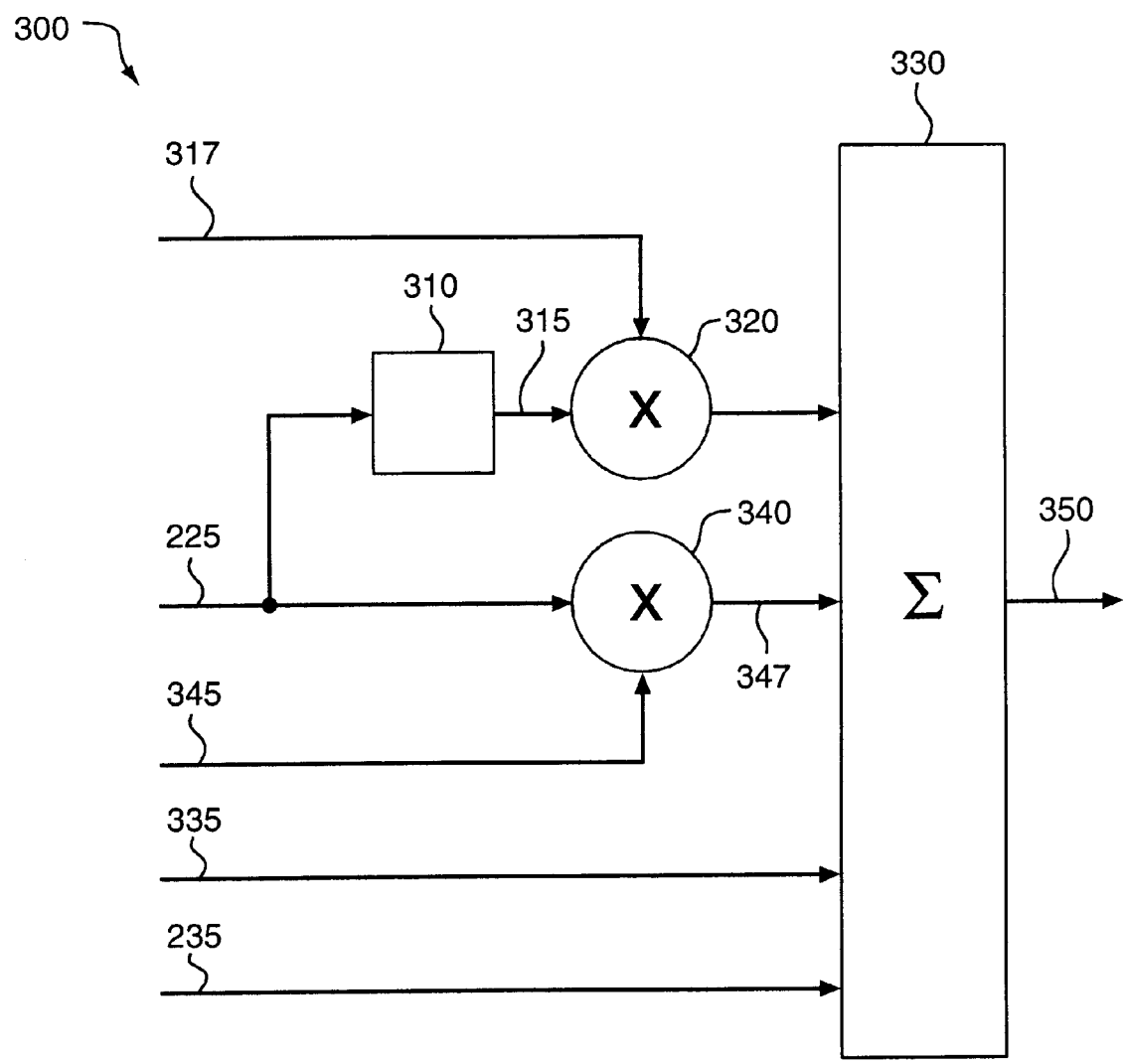
FIG. 3 is a block diagram of a root determination circuit according to the present invention.

Referring to FIG. 3, a root determination circuit 300 is illustrated, which is one of n identical circuits that are included in root determination block 240. The number of interleaves equals n. Circuit 300 includes a squarer 310 (a geometric function device) coupled to LFSR 220 by lead 225 to receive $\alpha^{-i}$. Squarer 310 is coupled to a multiplier 320 (an arithmetic function device) via a lead 315, and is coupled to receive coefficient $\Lambda_3^{(j)}$ from a lead 317. Multiplier 320 provides an output on lead 325 to adder 330 (an arithmetic function device).

A multiplier 340 (a geometric function device) is coupled to LFSR 220 via lead 225 to receive $\alpha^{-i}$ and is also coupled to a lead 345 to receive $\Lambda_2^{(j)}$. Multiplier 340 provides an output on a lead 347 to adder 330. Adder 330 is coupled to receive $\Lambda_1^{(j)}$ via a lead 335, and is coupled to LFSR 230 via lead 235 to receive $\alpha^i$. An output of adder 330 is provided on a lead 350. Note that root determination circuit 300 implements the function defined by Equation 3 for a jth interleave.

Each generated value of $\alpha^{-i}$ and $\alpha^i$, along with the calculated error-locator coefficients $\Lambda_1^{(j)}, \Lambda_2^{(j)}$, and $\Lambda_3^{(j)}$, are solved for Equation 3 on all n interleaves. The output on lead 350 will be active or set if $\alpha^{-i}$ is the root or zero of Equation 3 on the jth interleave. Otherwise, the output on lead 350 will be inactive or reset. The outputs of counter 210 are used to track the value of i for each $\alpha^{-i}$ that is a root of Equation 3.

The following discussion details the implementation of LSFRs 220, 230 with proof. For a Galois Field $GF(2^8)$, a binary irreducible primitive polynomial of degree 8, $$d(x) = x^8 + d_7 x^7 + d_6 x^6 + d_5 x^5 + d_4 x^4 + d_3 x^3 + d_2 x^2 + d_1 x + 1 \quad (4),$$

is used to construct the field elements $\alpha^i$, where i is an integer from 0 to 254. The preferred irreducible primitive polynomial is $$d(x) = x^8 + x^4 + x^3 + x^2 + 1 \quad (5).$$

In $GF(2^8)$, field element $\alpha^0 = 1$ (=00000001), $\alpha = x$ (=00000010), and $\alpha$ is the primitive element of $GF(2^8)$. Rollover occurs after i=255. In other words, $\alpha^{255 \cdot k + i} = \alpha^i$. Field element $a^{i+1}$ can be constructed inductively through polynomial multiplying $\alpha^i$ with a modulo d(x) for i=1, 2, . . . , 254. For example, $\alpha^2 = \alpha\alpha(\mod d(x)) = x^2 = 00000100$ $\alpha^3 = \alpha^2\alpha(\mod d(x)) = x^3 = 00001000$ $\alpha^4 = \alpha^3\alpha(\mod d(x)) = x^4 = 00010000$ $\alpha^5 = \alpha^4\alpha(\mod d(x)) = x^5 = 00100000$ $\alpha^6 = \alpha^5\alpha(\mod d(x)) = x^6 = 01000000$ $\alpha^7 = \alpha^6\alpha(\mod d(x)) = x^7 = 10000000$ $\alpha^8 = \alpha^7\alpha(\mod d(x)) = x^8 = x^4 + x^3 + x^2 + 1 = 00000100$ $\alpha^9 = \alpha^8\alpha(\mod d(x)) = x^2 = x^5 + x^4 + x^3 + x = 001110101.$ Therefore, as long as bit 7 of $\alpha^i$ is zero, multiplying $\alpha^i$ with $\alpha$ mod d(x) is equivalent to left-shifting $\alpha^i$ by one bit.

Figure 4:
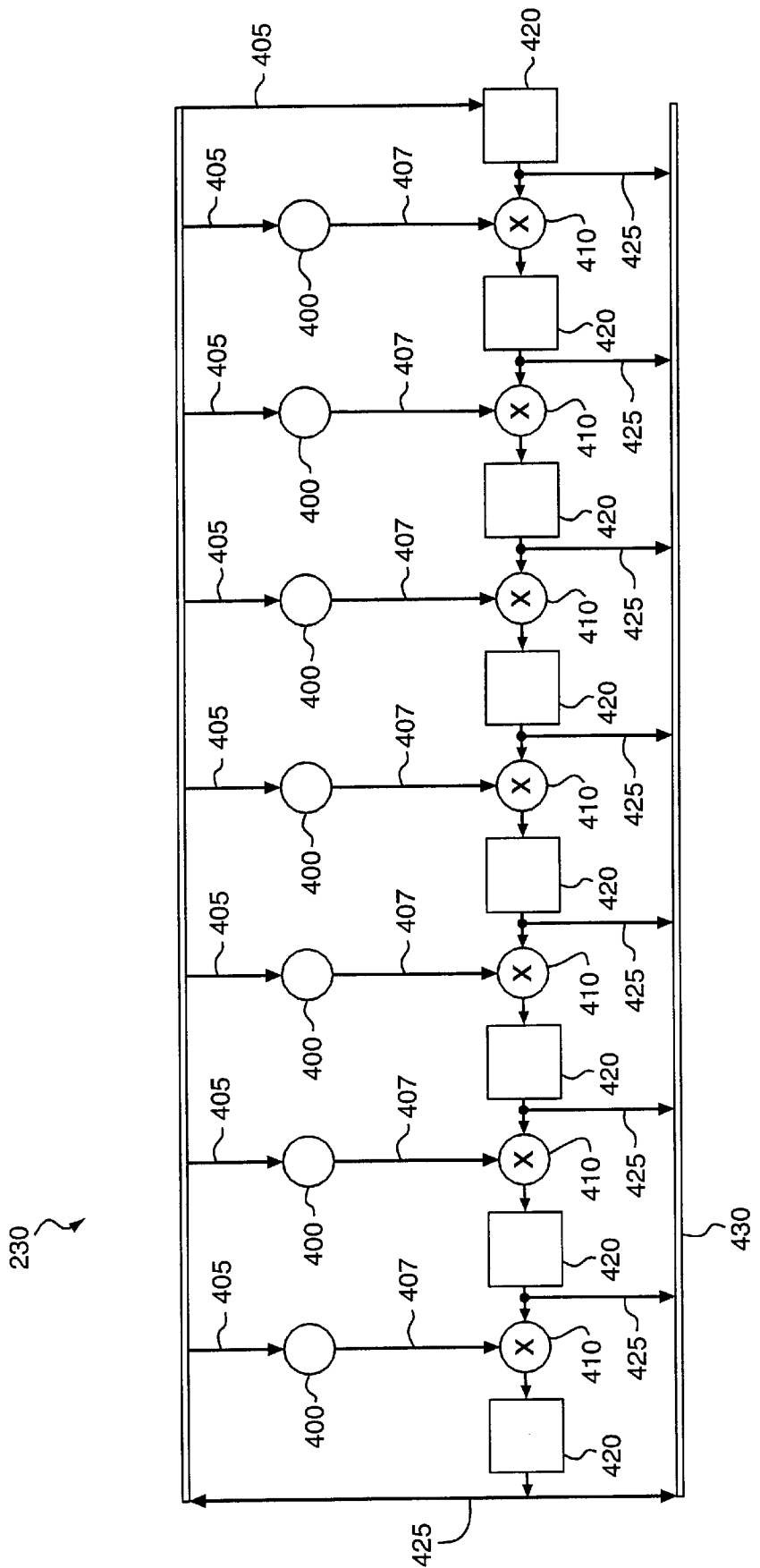
FIG. 4 is a block diagram of a linear-feedback shift register for calculating $\alpha^i$ according to the present invention.

Otherwise, it is equivalent to left-shifting $\alpha^i$ by one bit and adding (or exclusive-ORing) with $d_7x^7+d_6x^6+d_5x^5+d_4x^4+d_3x^3+d_2x^2+d_1x+1$. This can be realized with LFSR 230, preferably as shown in FIG. 4. FIG. 4 shows LFSR 230 that generates and provides $\alpha^i$ for consecutive values of i (log $\alpha^i$). LFSR 230 includes scalers 400 connected to leads 405 to receive values of x, which are either a 1 or a 0, from storage elements 420. The outputs of scalers 400 are provided on leads 407 to exclusive-OR logic 410.

Exclusive-OR logic 410 are coupled between pairs of series connected storage elements 420. Outputs of exclusive-or logic 410 are coupled to a bus 430 via leads 425. LFSR 230 is initialized to 1 (=$\alpha^0$) and successive clockings when enabled will produce in turn $\alpha^1, \alpha^2, \ldots \alpha^{254}$ at the output of the eight storage elements 420. Bus 430 provides the consecutive values of $\alpha$.

Figure 5:
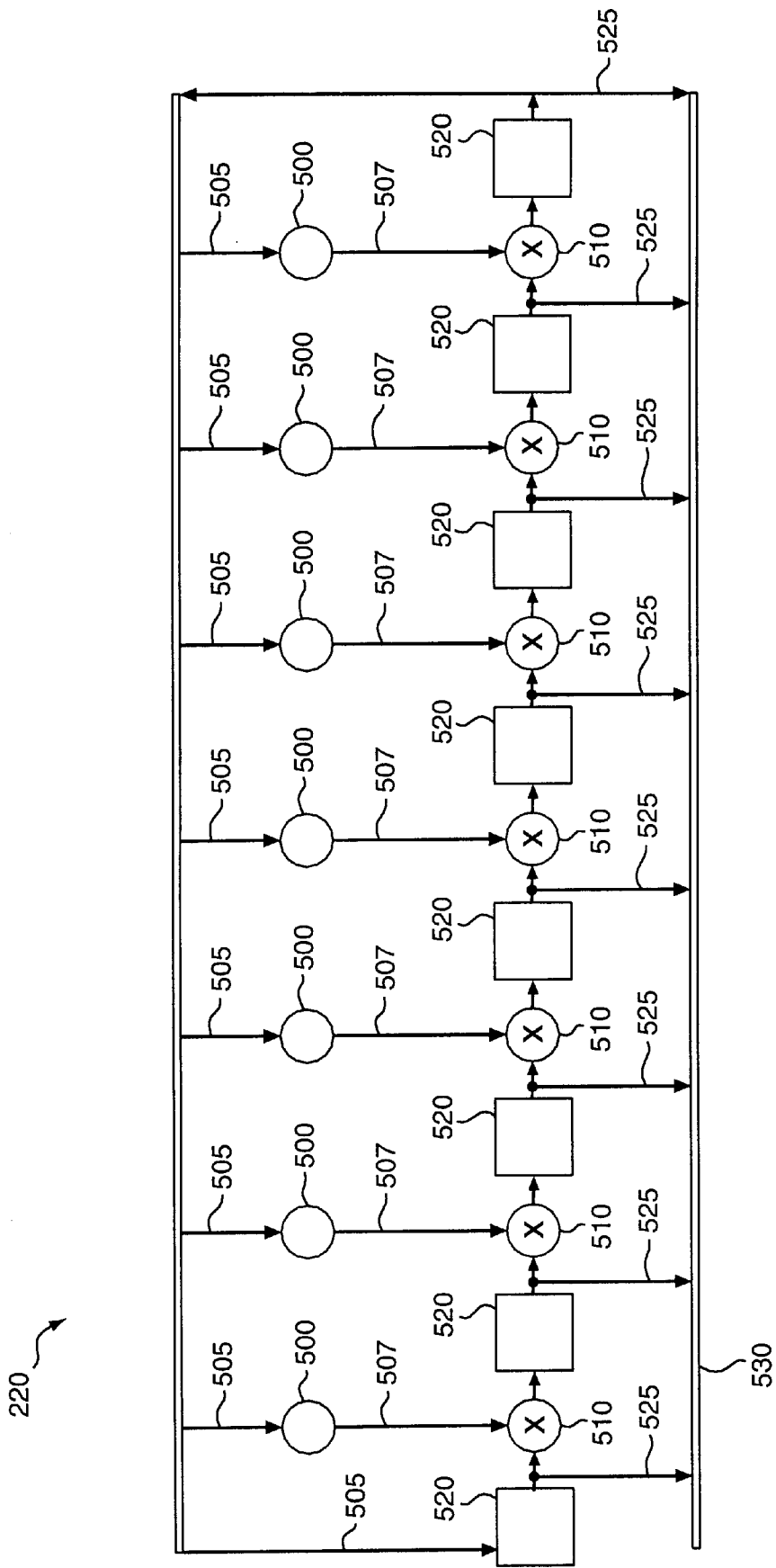
FIG. 5 is a block diagram of a linear-feedback shift register for calculating $\alpha^{-i}$ according to the present invention.

In the same manner, field element $\alpha^{-(i+1)}$ can be constructed inductively through polynomial dividing $\alpha^{-i}$ by a modulo d(x) for i=1, 2, . . . , 254. For example, $\alpha^{-1}=1/x=(d(x)+1)/x=x^7+d_7x^6+d_6x^5+d_5x^4+d_4x^3+d_3x^2+d_2x+d_1=x^7+x^3+x^2+x=10001110$ $\alpha^{-2}=\alpha^{-1}/\alpha=(x^7+x^3+x^2+x)/x=x^6+x^{12}+x+1=01000111$ $\alpha^{-3}=\alpha^{-2}/\alpha=x^5+x+1+(x^7+d_7x^6+d_6x^5+d_5x^4+d_4x^3+d_3x^2+d_2x+d_1)=10101101,\ldots$ As long as bit 0 of $\alpha^{-i}$ is zero, dividing by $\alpha^{-1}$ with a mod d(x) is equivalent to right-shifting $\alpha^{-i}$ by one bit. Otherwise, it is equivalent to right-shifting $\alpha^{-i}$ by one bit and adding (or exclusive-ORing) with $x^8+d_7x^7+d_6^6+d_5x^5+d_4x^4+d_3x^3+d_2x^2+d_1x$. This can be realized with LFSR 220, preferably as shown in FIG. 5. FIG. 5 shows LFSR 220 that generates and provides $\alpha^{-i}$ for consecutive values of i(log $\alpha^{-i}$). LFSR 230 includes scalers 500 connected to leads 505 to receive values of x, which are either a 1 or a 0, from storage elements 520. The outputs of scalers 500 are provided on leads 507 to exclusive-OR logic 510.

Exclusive-OR logic 510 are coupled between pairs of series connected storage elements 520. Outputs of exclusive-or logic 510 are coupled to a bus 530 via leads 525. LFSR 220 is initialized to 1 and successive clockings when enabled will produce in turn $\alpha^{-1}, \alpha^{-2}, \ldots \alpha^{-254}$ at the output of the eight storage elements 520.

The probability of miscorrection $P_{mc}$ with no burst limiting and prior to error detection by a host direct memory access ("DMA") is estimated to be $$P_{mc} = \frac{5}{255^3} \cdot \binom{N-4}{3} \cdot \sum_{i}^{N} \binom{N}{i} \cdot P^i \cdot (1-P)^{N-i}$$

where N is the size (in number of bytes) of the decoded sector (including 4 CRC bytes and 30 ECC bytes) integer divided by 5 (generally, the number of interleaves), and P is the raw channel symbol error rate. The number of ECC bytes is determined from 2t, where t is the maximum burst capability, multiplied by the number of interleaves. In this illustration, t=3 so that 2*3*5=30. Based on the typical raw bit error rate of 1.0E-7, the raw channel symbol error rate P should be around 8.0E-7, and the probability of miscorrection of a 512-byte sector is 1.4E-19.

With burst limiting, the probability of miscorrection can be approximated as the percentage of syndromes used for correction. For a single-burst mode of length $b_1$, the probability of miscorrection would be approximated as $$P_{mc} = \frac{n \cdot 2^{b_1-1}}{2^m} = \frac{n \cdot 2^{b_1-1}}{2^{240}}$$

where m is the total number of ECC redundant bits, n is the sector length (including CRC and ECC field) in number of bits. For 113-bit single burst correction of a 512-byte sector, the probability of miscorrection would be 1.3E-35.

For dual-burst mode, the probability of miscorrection is approximated as $$P_{mc} = \frac{n \cdot 2^{b_1-1} + n(n - b_{2_{min}})2^{b_{2_{min}}+b_{2_{max}}-2}}{2^{240}}$$

where $b_1$ is single-burst span, $b_{2_{min}}$ is small dual-burst span, $b_{2_{max}}$ is large dual-burst span. For example, for dual-burst correction of $b_{2_{min}}$=33 and $b_{2_{max}}$=73 bits, any single burst spanning no more than $b_1$=113 bits still meets this dual-burst correction criterion. A 512-byte sector dual burst correction in this case would yield a probability of miscorrection of 2.2E-34.

For triple burst mode of length $b_3$ (in number of bits), the probability of miscorrection is approximated as $$P_{mc} = \frac{n \cdot 2^{b_1-1} + n \cdot (n - b_{2_{min}}) \cdot 2^{b_{2_{min}}+b_{2_{max}}-2} + n \cdot (n - b_3) \cdot (n - 2b_3) \cdot 2^{3 \cdot (b_3-1)}}{2^{240}}$$

For a triple-burst correction of $b_3$=33 bits, any single burst spanning no more than $b_1$=113 bits or any dual burst spanning no more than $b_{2_{min}}$=33 and $b_{2_{max}}$=73 bits respectively still meets this triple-burst correction criteria. A 512-byte sector correction in this case would yield a probability of miscorrection of 3.9E-33.

With 32-bit CRC detection by the host DMA, the miscorrection will be improved by a factor of $2^{-32}$=2.3E-10. Thus the probability of miscorrection $P_e$ for a 512-byte sector would be approximately 3.2E-29 with no burst limit constraints, 3.1E-45 with a 113-bit single burst limit, 5.1E-44 with a dual-burst limit of 33 and 73 bits each, and 9.0E-43 with a 33-bit triple-burst limit.

Figures 6, 7A, 7B:
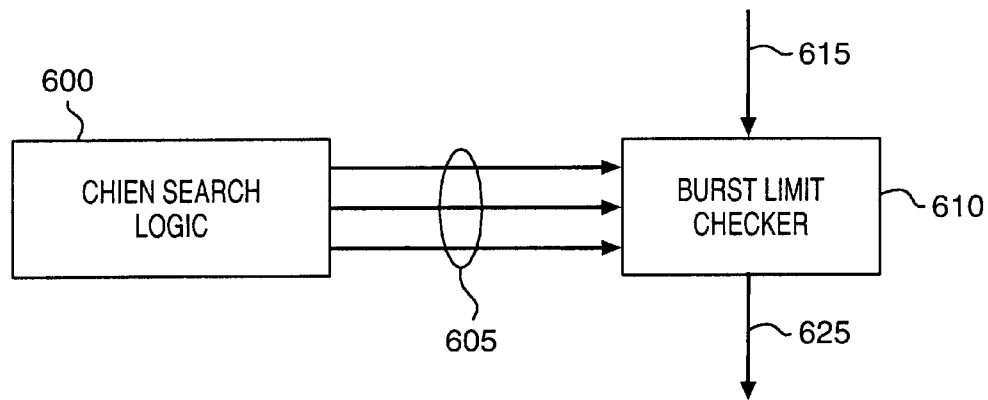
FIG. 6 is a block diagram of a burst-limiting device according to the present invention.
FIGS. 7A and 7B represent tables of outputs from a Chien search device.

FIG. 6 illustrates a burst-limiting device according to another aspect of the present invention. A Chien search logic 600 and a burst limit checker 610 are coupled together via leads 605. Chien search logic 600 preferably includes the Chien search device 200 shown in FIG. 1. Three leads 605 are shown which correspond to a three-way interleave. Each lead 605 provides an output which is either active when an error location is determined, or is inactive when the tested location is not in error.

Burst limit checker 610 also is coupled to receive via a lead 615 from a microprocessor (not shown) a burst limit control value. One function of burst limit checker 610 compares the sum of active signals provided by leads 605 to the burst limit control value. If the sum exceeds the value, then an output from burst limit checker 610 is set or active and provided on a lead 625.

Another function of the burst limiter 610 will be presented with reference to FIG. 6. Provided from the microprocessor on lead 615 is a burst size value that limits the total number of bytes (e.g., 15 bytes) for all programmed bursts. Decreasing this burst size along with the programmed burst limit value can significantly reduce the probability of miscorrection of the channel.

The microprocessor also provides a burst limit value that determines the number of bursts and the maximum burst error length. These values are illustrated as:

00—Burst limit disabled, the ECC will attempt to correct to its full capability.

01—Single burst limit with maximum burst error length equal to the programmed burst size value.

10—Dual burst limit with X-byte and Y-byte maximum burst error lengths per burst provided that the total of X and Y does not exceed the programmed burst size value.

11—Triple burst limit with Z-byte maximum burst error length per burst provided that the total of the Zs does not exceed the programmed burst size value.

A burst limit mode greater than 00b could be chosen to further reduce the probability of miscorrection if the channel error characteristics primarily match this mode.

Chien search logic 600 checks for errors at location j=0, 1, . . . , 255 in numerical order in all three interleaves in parallel. Concurrently, burst limit checker 610 performs burst limiting on all three interleaves using output error flag signals received on leads 605. Burst limit checker 610 uses the combination of these signals on leads 605 to determine burst size, number of bursts and burst error length within a sector. If the burst size, number of bursts or burst error length exceed the limit of burst size or the limits of the programmed burst limit value, an error signal is provided on lead 625.

Burst limit checker 610 provides on lead 625 a burst limit exceeded signal that indicates the distance in number of bytes has exceeded the limit of burst size or the limits specified by the burst size and burst limit values. This signal is set as soon as the correctability is determined, at which time the actual correction in the buffer memory will not have occurred. This bit is reset when a 1 is written to it or after the next sector is checked by the ECC.

For example, and with reference to FIGS. 6, 7A and 7B, a microprocessor programs burst limit checker 610 with a burst size value of nine bytes, and a double burst limit with six and three byte bursts. Chien search logic 600 provides on leads 605 to burst limit checker 610 the interleave error information provided in FIG. 7A. Each column j represents three values from Chien search logic 600, where each value signifies whether an error has occurred in a specific location of an interleave. This value is 0 for no error and 1 for an error. In other words, a root of the error locator polynomial has been found if the value is 1.

In this example, column 0 has no errors. Column 1 has three errors, which burst limit checker 610 tracks. Column 2 has two more errors and column 3 has none. Thus, the burst error length is five bytes, so that burst limit checker 610 detects a first burst error having less than a maximum length of six bytes. Column 4 has two errors, and column five has no errors. The burst error length is three, and a second burst error having a maximum length of three bytes is found. The remaining columns contain no errors. As a result, a burst limit exceeded signal is not set by burst limit checker 610.

For another example, Chien search logic 600 provides on leads 605 to burst limit checker 610 the interleave error information provided in FIG. 7B. Column 0 has no errors, column 1 has three errors, column 2 has two errors and column 3 has none. Thus, the burst error length is five bytes, so that burst limit checker 610 detects a first burst error having less than a maximum length of six bytes. Column 4 has two errors, and column five has one error. The burst error length is four, and the second burst error exceeds the maximum length of three bytes. Consequently, the burst limit exceeded signal is set by burst limit checker 610 and provided on lead 625.

Generally, the method of the present invention checks the error signals of the interleaves to determine if the number of error bursts, burst error lengths or burst size is exceeded. These values are predetermined limits. To this end, the present invention tracks the number of errors and attempts to "fit" the errors in the programmed parameters of the burst size and burst limit values, such as illustrated above. If there is no fit, then an error signal is provided by burst limit checker 610.

In particular, and with reference to the examples above, the method of the present invention tracks that there is a first error burst. The method then classifies the burst error length of that first error burst with the minimum burst error length. In the above-example, the first error burst has a length of five bytes, which is greater than the programmed burst error length of three bytes and less than programmed burst error length of six bytes. As a result, the method tracks that a first burst error has occurred with that burst classified as a burst error length of six bytes (although the actual length was less than six).

When the present method operates in a single or triple burst mode, then the burst error length is classified as one programmed burst error length. Of course, the triple burst mode can have three programmed burst error lengths that are not equivalent, but still sum to the burst size value. In that situation, the method would classify each actual burst error length as the minimum programmed burst error length that is not exceeded by the actual burst error length.

The present invention is particularly advantageous for storage systems, e.g., hard disk drives. To illustrate, data field error detection and correction are performed by appending to the data field four error section (CRC) parity bytes which are then XORed with four Sector Address bytes followed by thirty error correction (ECC) parity bytes. The correction parity bytes are based upon codes generated from a 256-symbol Galois Field with an irreducible polynomial of:

$$x^8+x^4+x^3+x^2+1,$$

and the primitive field element of 00000010.

Error detection is applied to the sector data field, while error correction is applied to the concatenation of the error detection field to the sector data field. The relationship between the sector data, CRC, and ECC fields is illustrated below:

| Sector Data (4 to 1241 bytes) | CRC (4 bytes) | ECC (30 bytes) |

The CRC is calculated on 8 bits in parallel, using the preferred generator polynomial:

$$x^{32}+x^{26}+x^{23}+x^{22}+x^{16}+x^{12}+x^{11}+x^{10}+x^{8}+x^{7}+x^{5}+x^{4}+x^{2}+x+1$$

Encoding and decoding of the CRC is accomplished through the application of the sector data field to an 8-bit wide 4-stage linear feedback shift register (LFSR) which operates as a polynomial divider. The concatenation of the remainder in the LFSR to the sector data field produces a legitimate codeword that should be divisible (using Finite Field Algebra) by the generator polynomial.

During a sector write, the host DMA encodes the sector data and appends four CRC bytes. The ECC engine 130 (FIG. 1) XORs these four raw CRC bytes with four Logical Sector Address (LSA) bytes and passes the resulted LSA encoded CRC bytes to data formatter 145 (FIG. 1). At the same time, ECC engine 130 also checks for CRC errors by re-encoding the sector data and comparing the encoded CRC bytes with the CRC bytes encoded by the Host DMA. Preferably, predetermined bits of a register will be set should there occur any CRC mismatch.

During a disk read, the error detection after correction for sectors with correctable errors will be performed at the host DMA. Therefore, the CRC logic within ECC engine 130 remain idle during a read and all four LSA-encoded CRC bytes read from the disk will be treated as data bytes by ECC engine 130. Once a sector (data and CRC bytes) is released from the buffer to the host DMA (after either a good sector is decoded by the ECC or a completion of buffer correction performed by the ECC), it will be decoded again by the host DMA. A CRC error at this point will flag the sector as uncorrectable due to either a miscorrection or a data transfer corruption between the buffer and the DMA.

A preferred error correction code is a 5-way interleaved triple-error correcting Reed-Solomon code (RS-3). The generator polynomial for each interleave is:

$$g_e(x)=(x+\alpha^1)\ (x+\alpha^2)(x+\alpha^3)(x+\alpha^4)(x+\alpha^5)(x+\alpha^6);\ g_e(x)=x^6+\alpha^{167}x^5+\alpha^2x^4+\alpha^2x^4+\alpha^{137}x^3+\alpha^9x^2+\alpha^{181}x+\alpha^{21}$$

Encoding of the error correction code is accomplished through the application of the sector data and the detection fields to an 8-bit wide 30-stage LFSR that operates as a polynomial divider for each of the five interleaves. During a sector write, the concatenation of the remainder in the LFSR to the sector data and detection fields produces a set of five interleaved codewords that should be divisible (using Finite Field Algebra) by the generator polynomial. Decoding of the error correction code is accomplished by use of six separate byte-wide, 5-stage polynomial divider LFSRs, where $$g_{d(n)}(x)=(x+\alpha^n),$$

for each of n=1, 2, . . . , 6. The remainder in each of the decoder LFSRs directly produces the six partial syndromes for each of the five interleaves.

ECC engine 130 generates thirty ECC partial syndromes as data is transferred from the disk to the buffer. After the last byte of the ECC field is read, ECC engine 130 examines the contents of each of the these ECC partial syndromes. If all zeroes are contained therein, a register bit is set indicating that no errors are detected and ECC engine 130 takes no further action. Otherwise, register bits are asserted, all thirty ECC partial syndromes are stored and the correction circuitry is activated to perform the following sequence of actions.

For each interleave, the correction partial syndromes are used to calculate the number of errors detected. If more than three errors are detected in any interleave, an Uncorrectable Error ("UnCorErr") register bit is asserted and the correction is halted. Otherwise, the error locations and their corresponding mask values are determined. Concurrent to the calculation of the error locations on all five interleaves (performed in parallel), the calculated error locations are examined immediately to determine if predetermined burst limits are exceeded. If so, a Burst Limit Exceeded ("BrstLimEx") register bit is asserted. After the burst limit measurements or the calculations of error locations are completed, ECC engine 130 examines the BrstLimEx and UnCorErr bits. If either is asserted, operation of the circuit halts. Otherwise, the Correctable Error ("CorErr") bit is asserted. ECC engine 130 proceeds to calculate the error masks associated with the error locations found. Once all the error masks are determined, data stored in a buffer memory is corrected by XORing the values with the error mask values at the corresponding error locations. After all corrections have been performed, the ECC operation halts.

The ECC design preferably has three levels of pipelining. Reading or decoding a sector, calculating error locations and values, and correcting data in buffer memory take place separately at the first, second and third pipelining level respectively. This will reliably guarantee "On-the-Fly" correction even for the worst case scenario where three consecutive sectors with correctable errors are read from the disk. In other words, while the last (third) sector is being read from the disk, the error correction logic is performed on the second sector and buffer correction is performed on the first sector. The second pipeline determines the error locations and error masks of the second sector, and passes the information to the third pipeline for buffer correction before the first pipeline finishes reading the third sector so that it can continue the error calculation for the third sector. The remaining time (roughly more than one full sector time) will be used for corrections to buffer memory. In the event that the second pipeline is still performing error calculations for the second sector when the first pipeline finishes reading the third sector, correction for the second sector is still allowed to be done but correction for the third sector will be prevented. This indicates a data overflow condition.

Numerous variations and modifications of the embodiment described above may be effected without departing from the spirit and scope of the novel features of the invention. For instance, one skilled in the art will recognize that many of the functions can be implemented in firmware. Furthermore, the present invention can be used with any number of interleaves. The more interleaves used, the more errors can be corrected. The present invention preferably allows three errors per interleave. The total number of interleaves multiplied by three provides the burst size value. When using multiple burst limits, e.g., double- and triple-burst limits, the burst error lengths for all the bursts equal the burst size value.

However, the tradeoff for using more interleaves is that more circuitry and ECC bytes are required. Each interleave will require its own root determination circuit 300. Also, burst limit checker 610 would require more circuitry to function with more interleaves. Ultimately, the tradeoff is cost and time for increased error correction capability.

It is to be understood that no limitations with respect to the specific device illustrated herein are intended or should be inferred. It is, of course, intended to cover by the appended claims all such modifications as fall within the scope of the claims.

I claim:

1. A method of reducing a probability of miscorrecting a detected error in a received data field comprising the steps of:
    receiving error location signals associated with the received data field;
    determining at least one actual burst characteristic based on the received error location signals; and
    halting correction of the detected error in the received data field if the at least one actual burst characteristic exceeds a predetermined limit.

2. The method of claim 1 further comprising the step of providing a signal when the at least one actual burst characteristic exceeds the predetermined limit.

3. The method of claim 1 further comprising the step of comparing the at least one actual burst characteristic with the predetermined limit concurrently with the step of receiving error location signals.

4. The method of claim 1 wherein the at least one actual burst characteristic includes a deterministic size of the detected error in the received data field and the predetermined limit includes a burst size value.

5. The method of claim 1 wherein the at least one actual burst characteristic includes a deterministic size of a multiple-burst span in the detected error in the received data field and the predetermined limit includes burst error length value.

6. The method of claim 1 wherein the at least one actual burst characteristic includes a deterministic number of burst spans within the detected error in the received data field and the predetermined limit includes a number of bursts value.

7. The method of claim 1 wherein the predetermined limit is programmable.

8. A method for reducing a probability of miscorrecting a detected error in a received data field, the method comprising:
    generating output error flag signals from a Chien Search circuit;
    receiving the output error flag signals associated with the received data field;
    determining at least one of a burst size characteristic, a number of bursts characteristic, and a first burst error length characteristic associated with the detected error;
    evaluating at least one of the characteristics relative to a programmed limit; and
    providing a signal if the at least one of the characteristics exceeds the programmed limit.

9. The method of claim 8 further comprising correcting the detected error in the received data field only if the at least one of the characteristics does not exceed the programmed limit.

10. The method of claim 8 wherein the evaluating operation is performed concurrently with the receiving operation.

11. The method of claim 8 wherein the generating operation comprises generating the output error flag signals in parallel in accordance with the data interleaves of a three-way interleaved data field.

12. The method of claim 8 wherein the programmed limit comprises a first burst error length limit and a second burst length limit that sum to equal a burst size limit.

13. The method of claim 12 wherein the evaluating operation comprises:
    determining the first burst error length characteristic with a first burst span in the detected error of the received data field;
    determining a second burst error length characteristic for a second burst span in the detected error of the received data field;
    classifying the first burst error length characteristic into a first class associated with the first burst error length limit, if the first burst error length characteristic does not exceed the first burst error length limit;
    classifying the second burst error length characteristic into a second class associated with the second burst error length limit, if the second burst error length characteristic does not exceed the second burst error length limit.

14. The method of claim 13 wherein the operation of providing comprises providing the signal if the first or second burst error length characteristic is unclassified.

15. A system for reducing a probability of miscorrecting a detected error in a received data field, the system comprising:
    a root determination circuit for generating output error flag signals;
    a burst limit checker coupled to the root determination circuit for receiving the output error flag signals associated with the received data field and for comparing an actual burst characteristic to a predetermined limit; and
    an output from the burst limit checker for issuing a signal to halt correction of the detected error if the actual burst characteristic exceeds the predetermined limit.

16. The system of claim 15 further comprising an input to the burst limit checker for receiving the predetermined limit programmed from a microprocessor.

17. The system of claim 15 wherein the root determination circuit includes Chien Search circuitry.

18. The system of claim 15 wherein the actual burst characteristic is determined from the output error flag signals.

19. The system of claim 15 where the actual burst characteristic is the size of a burst in the received data field.

20. The system of claim 15 where the actual burst characteristic is the number of bursts within the detected error of the received data field.

* * * * *